(12) United States Patent
Simon

(10) Patent No.: US 7,198,173 B2
(45) Date of Patent: Apr. 3, 2007

(54) RECEIVING DEVICE FOR DRUG BLISTERS

(76) Inventor: Udo Simon, Virchowstrasse 16, Nuernberg (DE) 90409

( * ) Notice: Subject to any disclaimer, the term of this patent is extended or adjusted under 35 U.S.C. 154(b) by 234 days.

(21) Appl. No.: 10/474,031

(22) PCT Filed: Apr. 10, 2002

(86) PCT No.: PCT/DE02/01325

§ 371 (c)(1), (2), (4) Date: Mar. 1, 2004

(87) PCT Pub. No.: WO02/083056

PCT Pub. Date: Oct. 24, 2002

(65) Prior Publication Data

US 2004/0129718 A1 Jul. 8, 2004

(30) Foreign Application Priority Data

Apr. 10, 2001 (DE) .................. 101 17 907

(51) Int. Cl.
  G07F 11/66 (2006.01)
  G07F 11/00 (2006.01)
  B65D 83/04 (2006.01)
  B65D 85/42 (2006.01)
  G05G 1/14 (2006.01)
(52) U.S. Cl. .................. 221/25; 221/5; 206/531; 74/513
(58) Field of Classification Search .................. 221/2, 221/5, 6, 7, 3, 15, 25, 123; 74/513; 206/531
See application file for complete search history.

(56) References Cited

U.S. PATENT DOCUMENTS

| | | | | | |
|---|---|---|---|---|---|
| 4,617,557 | A | * | 10/1986 | Gordon | .................. 340/309.7 |
| 4,660,991 | A | * | 4/1987 | Simon | .................. 368/10 |
| 4,858,207 | A | * | 8/1989 | Buchner | .................. 368/10 |
| 4,905,866 | A | * | 3/1990 | Bartell et al. | .................. 221/5 |
| 5,348,158 | A | * | 9/1994 | Honan et al. | .................. 206/531 |
| 5,412,372 | A | * | 5/1995 | Parkhurst et al. | .................. 340/568.1 |
| 5,431,283 | A | * | 7/1995 | Weinstein et al. | .................. 206/531 |
| 5,464,118 | A | * | 11/1995 | Grau et al. | .................. 221/5 |
| 5,673,793 | A | * | 10/1997 | Seidler | .................. 206/531 |
| 5,816,404 | A | * | 10/1998 | Seidler | .................. 206/461 |

(Continued)

FOREIGN PATENT DOCUMENTS

DE  40 01 645  8/1991

(Continued)

*Primary Examiner*—Gene O. Crawford
*Assistant Examiner*—Rakesh Kumar

(57) ABSTRACT

A holding device for pharmaceutical blisters has an upper part and a lower part between which a pharmaceutical blister is disposed. Ejection openings are disposed in both the upper part and the lower part in a pattern that corresponds to the pattern of the contained dragées. An ejection device that can execute a linear movement and/or a rotary movement in relation to the upper part has an ejection ram, which optionally can be guided into a certain ejection opening of the upper part to remove a corresponding dragée. The ejection device has a contact element, which in the desired ejection position short-circuits a pair of contact points with a contact field to display the desired ejection position. The contact field for each possible ejection position short-circuits only one pair of contact points corresponding to the desired ejection position through the contact field.

25 Claims, 10 Drawing Sheets

U.S. PATENT DOCUMENTS 5,871,831 A * 2/1999 Zeiter et al. .................. 428/76
5,909,822 A * 6/1999 George et al. ................ 221/25
6,098,835 A * 8/2000 DeJonge ...................... 221/25
6,163,736 A * 12/2000 Halfacre .................... 700/232

FOREIGN PATENT DOCUMENTS

| | | |
|---|---|---|
| DE | 41 34 237 | 4/1993 |
| DE | 4134237 C1 * | 4/1993 |
| DE | 199 38 298 | 2/2001 |
| EP | 1 214 924 | 6/2002 |

* cited by examiner

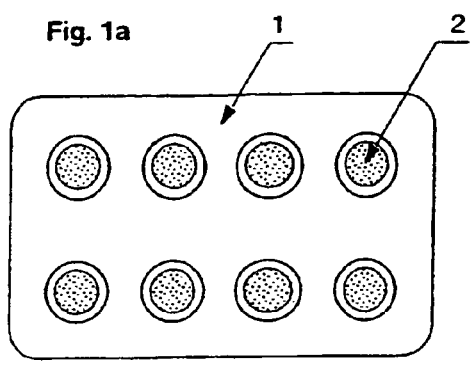
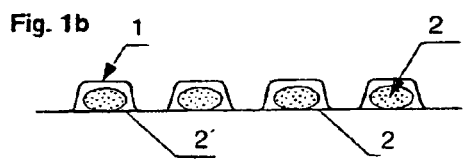
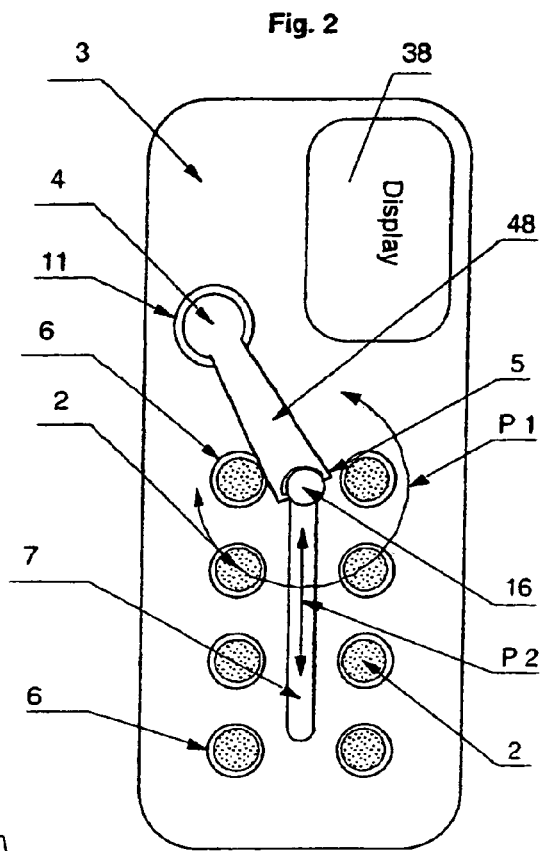
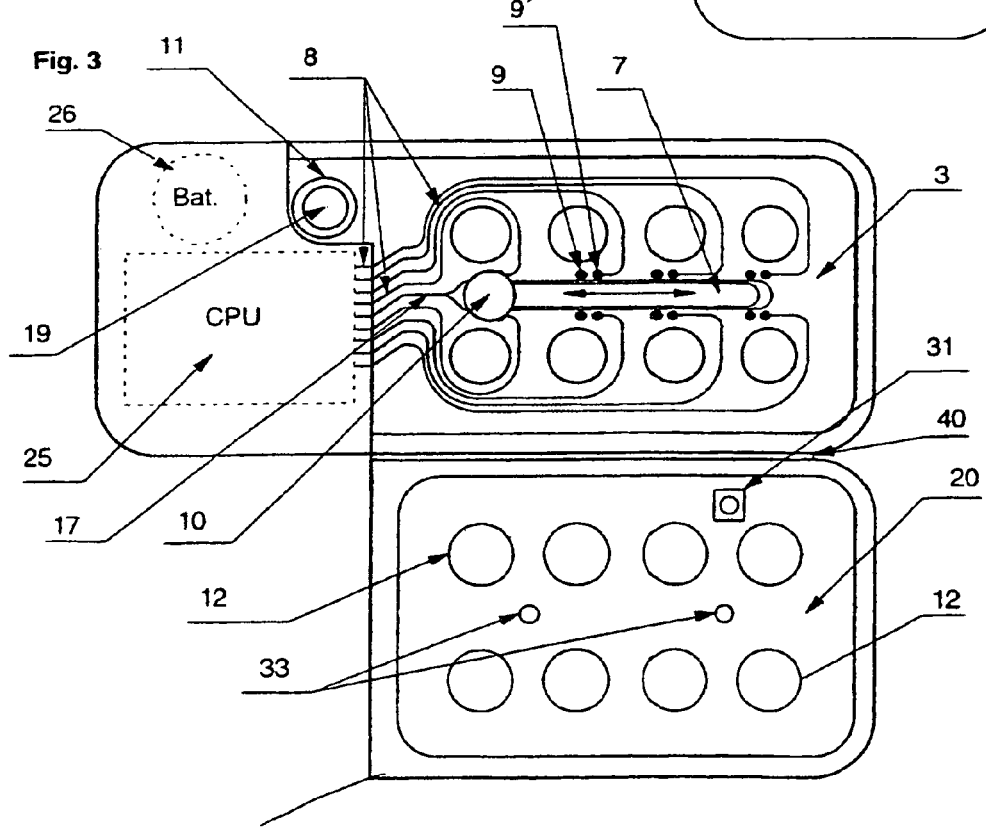

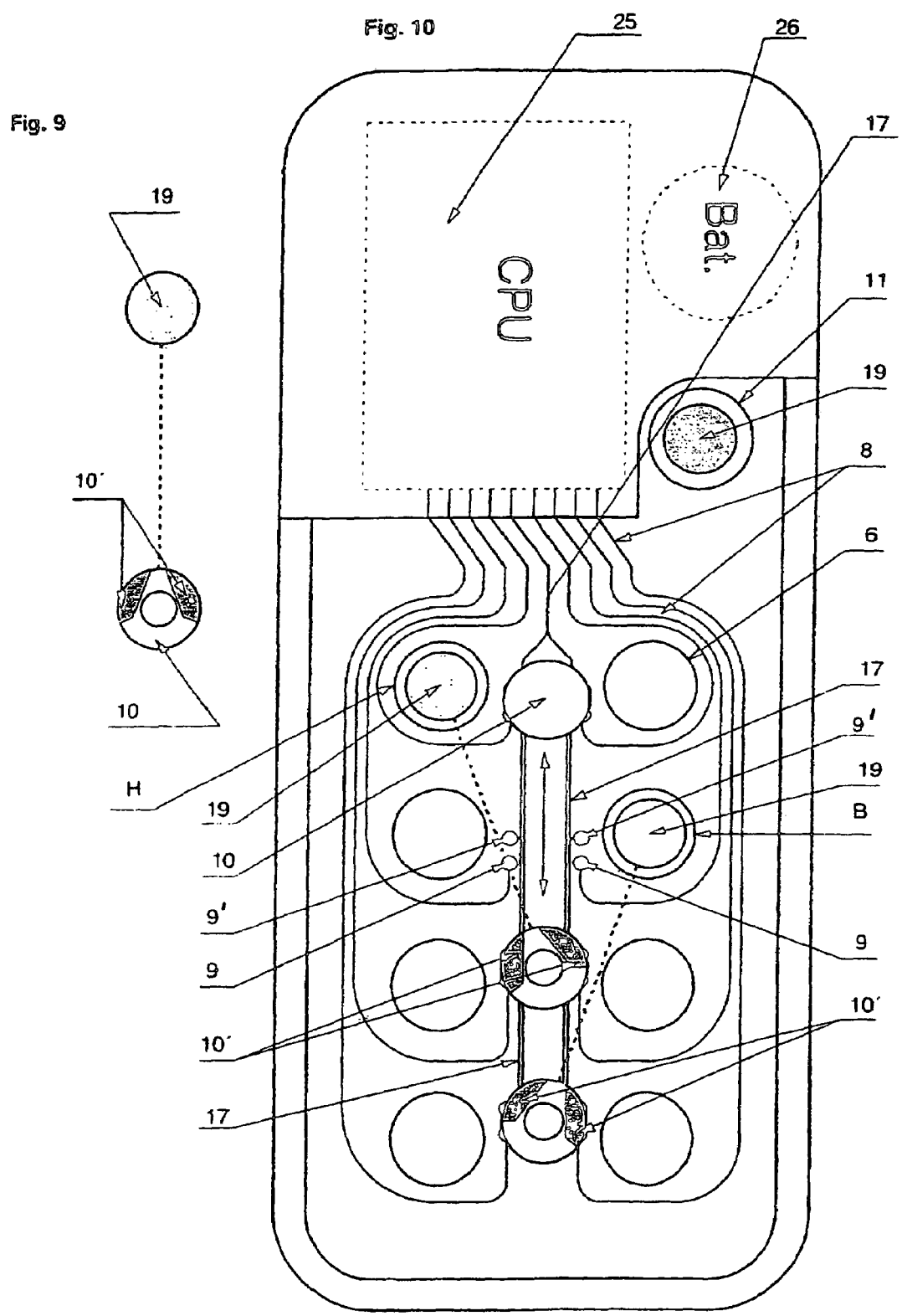

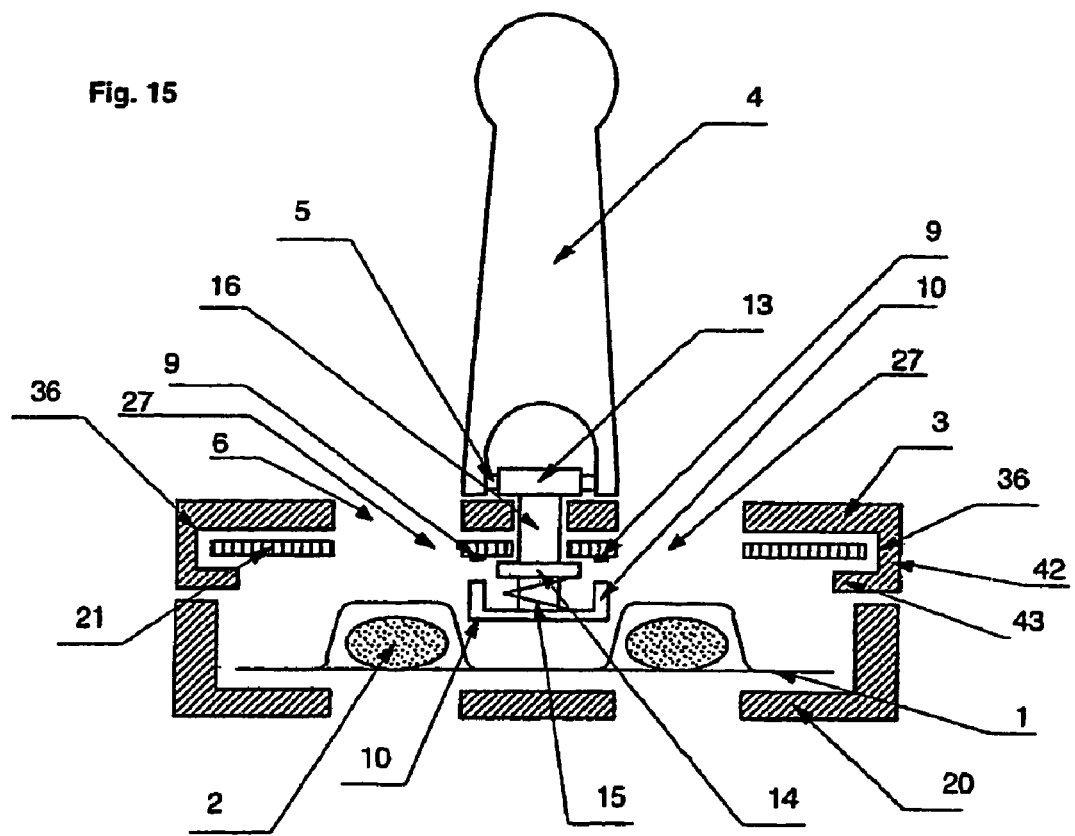

RECEIVING DEVICE FOR DRUG BLISTERS

This is a nationalization of PCT/DE02/01325 filed Apr. 10, 2002 and published in German.

BACKGROUND OF THE INVENTION

1. Field of the Invention

The present invention relates to a pharmaceutical blister holding device with an upper part and a lower part between which the pharmaceutical blister is disposed, and with ejection openings disposed in the upper and lower parts conforming to the pattern of dragées contained therein.

2. Description of the Prior Art

A holding device of this type follows from DE 40 01 645 C2. Therein a pharmaceutical blister is disposed between an upper part and a lower part of the holding device. Thereon an ejection device is provided for ejecting the individual dragées contained in the pharmaceutical blister, said ejection device being displaceable and/or turnable on the upper part in such a manner that an ejection ram can be brought over the position of the dragée to be ejected from the pharmaceutical blister so that it can be guided through openings, aligned to the dragée, of the upper and lower part. A device working together with the ejection device to query and/or record the position of the ejection ram has an electromechanical position-measuring device which can be activated by the ejection device, from which electromechanical position-measuring device the linear and/or rotary movements of the ejection device are unambiguously recorded and converted into position measurement signals. In this way those locations of the pharmaceutical blister at which dragées are or have been ejected from the pharmaceutical blister can be sensed exactly.

From the German Utility Model G 98 14 297.7 an additional holding device for a pharmaceutical blister follows in which a holding device with an ejection device for the ejection of each dragée from the pharmaceutical blister is disposed so that it can be moved along a straight and/or circular interval.

The objective of the present invention consists of developing a holding device for pharmaceutical blisters with an ejection device so that a relatively simple recording of the ejection positions is possible.

SUMMARY OF THE INVENTION

This objective is realized by a holding device with an upper part and a lower part between which a pharmaceutical blister can be disposed. Conforming to the pattern of the dragées, upper ejection openings are disposed in the upper part and lower ejection openings are disposed in the lower part. An ejection device which can execute a linear movement and/or a rotary movement in relation to the upper part has an ejection ram which optionally can be guided into a certain ejection opening of the upper part to remove a corresponding dragée. The ejection device has a contact element which in the intended ejection position of the ejection ram short-circuits a pair of contact points with a contact field to display the intended ejection position. The contact field for each possible ejection position short-circuits only one pair of contact points corresponding to the intended ejection position through the contact field.

The significant advantage of the present invention consists of the fact that simple and cost-effective, technologically easily realizable recording and storing of the ejection positions at which dragées were taken from a pharmaceutical blister disposed in the holding device are possible. Display errors are advantageously reduced to a minimum therein.

Preferably the holding device, according to the invention, for pharmaceutical blisters has evaluation electronics through which, during the actuation of the ejection device, the individual ejection positions can be recorded and stored for the purposes of subsequent evaluation.

BRIEF DESCRIPTION OF THE DRAWINGS

In the following the invention and its developments are explained in more detail in connection with the figures. Shown are:

FIGS. 1a, 1b representations of a known pharmaceutical blister,

FIG. 2 a view from above of a holding device according to the invention, where the ejection device is in a parked position, FIG. 3 the holding device of FIG. 2 in the open state, where no pharmaceutical blister has been laid in, FIG. 4 the holding device of FIG. 3, where a pharmaceutical blister has been laid into the lower part, FIG. 5a a side view of the ejection device separated from the holding device, FIG. 5b a longitudinal section through the holding device on which the ejection device is disposed, FIG. 6 a cross-section through the holding device according to the invention to explain the function of the ejection device, FIG. 7 a longitudinal section through the holding device to explain the function of the ejection device, where it is in the elevated position, FIG. 8 a representation similar to FIG. 7, where the ejection device is in the ejection position, FIG. 9 a view from above of the contact element of the ejection device, FIG. 10 a view of the inner side of the upper part of the pharmaceutical container and of the contact element as well as a representation of the course or the arrangement of the printed conductors and contact points, where various positions of the ejection device are represented, FIG. 11 a representation similar to FIG. 10, where the individual alignments of the contact elements of the contact element are represented in the various ejection positions, FIGS. 12 to 15 an extension of the holding device according to the invention with a child safety device, FIGS. 16 and 17 forms of embodiment to explain the electrical connection of the evaluation electronics and the printed conductors, and FIG. 18 an extension of the invention.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

According to FIGS. 1a, 1b a known pharmaceutical blister 1 consists essentially of a plastic foil which forms the holding pockets for dragées 2 which are sealed with a sealing foil 2' which preferably consists of aluminum.

Figure 4:
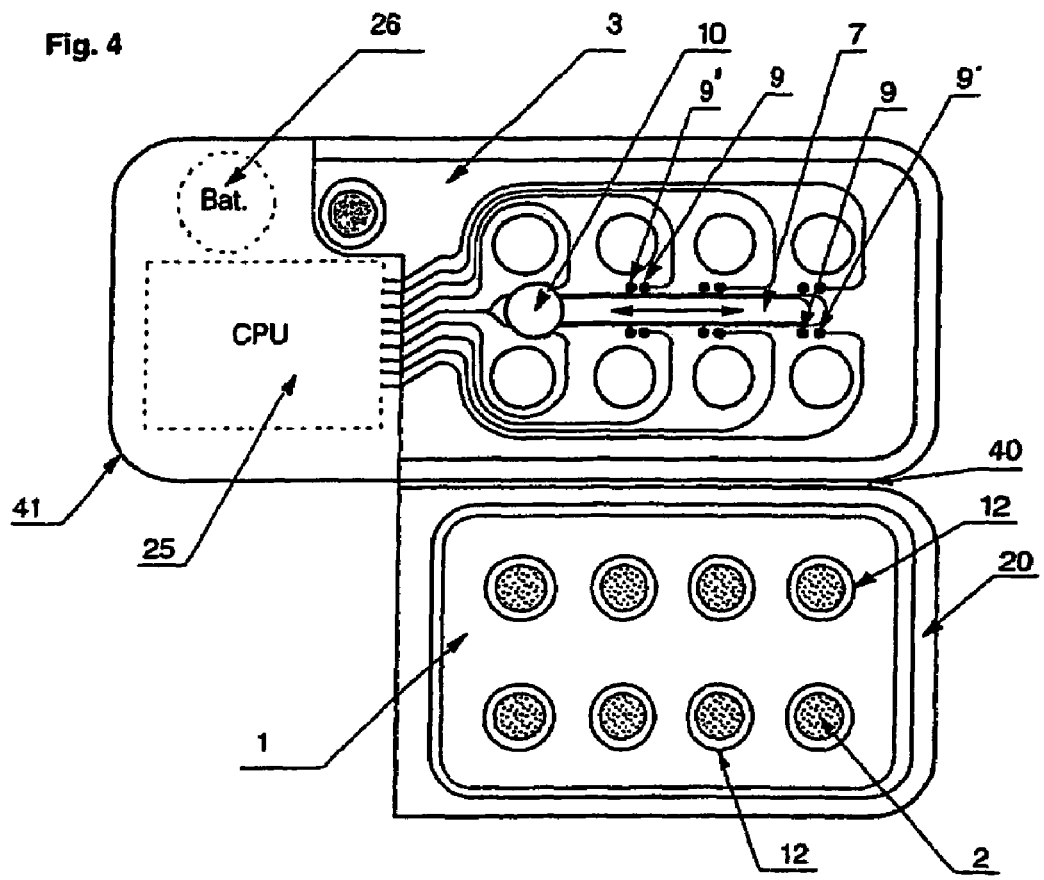

According to FIGS. 2 to 4 the present holding device for a pharmaceutical blister 1 comprises essentially an upper part 3, a lower part 20, and an ejection device 4.

The ejection device 4 is disposed on the upper part 3, as, for example, is the case in DE 40 01 645 C2 cited initially. The upper part 3 has upper ejection openings 6 which are disposed conforming to the pattern of the dragées 2, or tablets/pharmaceuticals, present in the pharmaceutical blister 1 to be used.

Conforming to this pattern, lower ejection openings 12 are also disposed in the lower part 20. When used, the pharmaceutical blister 1 is laid into the lower part 20 (FIG. 4), where the dragées 2 are aligned to the lower ejection openings 12. In order to simplify the laying of the pharmaceutical blister 1 into the lower part 20, it preferably has an edge area 39 projecting perpendicularly from its plane at the side of the pharmaceutical blister 1 (FIG. 5b), said edge area encircling the laid-in pharmaceutical blister 1. The exact positional orientation of the pharmaceutical blister 1 is done preferably by guides at the dragée cups, since the edge areas of the pharmaceutical blister 1 usually have significant stamping tolerances. For sealing the holding device the upper part 3 is set on the lower part 20 as, for example, is represented in FIG. 5b. In so doing, the upper part 3 and the lower part 20 can be interlocked with the aid of the snapping elements not explained in more detail. The upper part 3 and the lower part 20 can preferably be connected to one another in a fixed manner at a longitudinal edge, for example, also with the aid of a film hinge 40, as FIGS. 3 and 4 show.

If in the holding device a pharmaceutical blister 1 is disposed between the lower part 20 and the upper part 3 and the lower part 20 is locked on the upper part 3, e. g. with the aid of the cited snapping element, the upper ejection openings 6 of the upper part 3 are aligned to the dragées 2 of the pharmaceutical blister 1 and to the lower ejection openings 12 of the lower part 20 on which the pharmaceutical blister 1 lies.

Figure 5A:
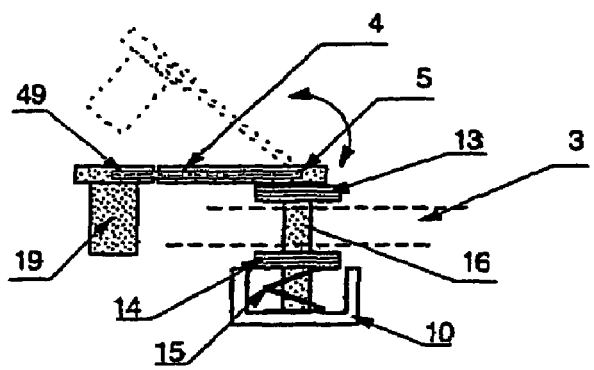
Figure 5B:
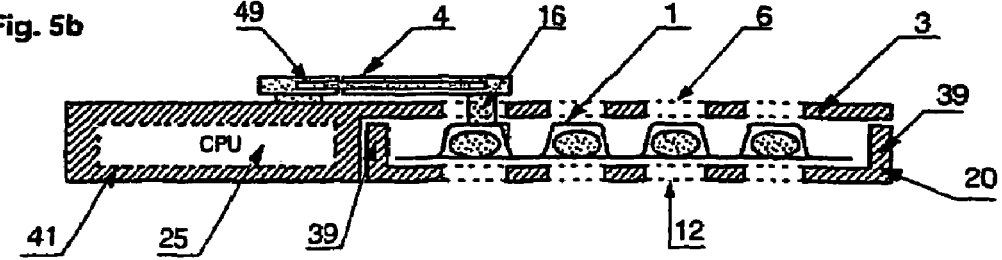
Figure 6:
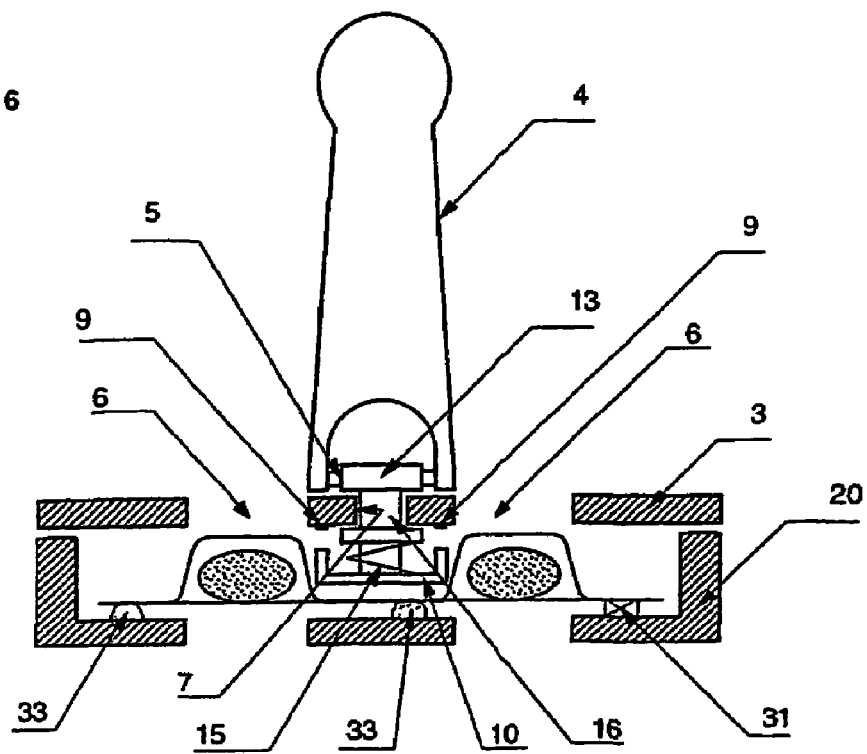

On the upper part 3, as, in particular, FIG. 5a also shows, the ejection device 4 is disposed, which has an upper sliding part, preferably an upper sliding plate 13, which is mounted in such a manner that it can be displaced in the direction of the longitudinal extension of the upper part 3, or the pharmaceutical blister 1 lying under it, with a formed-on shaft 16 in an upper part guide slot 7 running in the longitudinal direction (arrow P2 in FIG. 2). The ejection device 4 can be turned about the shaft 16 in relation to the upper part 3 (arrow P1 in FIG. 2). The sliding plate 13 lies on the edge areas of the upper side of the upper part guide slot 7 of the upper part 3 and is fixed on the shaft 16.

Through the upper sliding plate 13, which preferably is structured in the form of a circle, an axis 5 runs along the direction of a diameter of the upper sliding plate 13 transversely to the axis of the shaft 16, on which axis an elongated ejection part 48 is held in such a manner that it can be pivoted, where the ejection part 48 has, on its side opposite the sliding plate 13, an ejection ram 19 projecting in the direction of the upper part 3, where said ejection ram preferably can be pivoted about an axis 49 running parallel to the axis 5. Preferably the end of the ejection part 48 opposite the ejection ram 19 is structured in the form of a fork, where the axis 5 can be formed by projections which project out from the sliding plate 13 and engage in indentations of the fork arms. In this way it is ensured that the ejection part 48 and the ejection ram 19 can be lifted from the plane of the sliding plate 13.

The upper sliding plate 13 has the shaft 16 extending perpendicularly to its plane, said shaft 16 running through the upper part guide slot 7 of the upper part 3 and on which a lower sliding plate 14 is located at a distance from the sliding plate 13 below the upper part 3, said lower sliding plate being held in such a manner that it can slide in the longitudinal direction of the shaft 16. The sliding plates 13 and 14 are dimensioned so that they protrude by their edge areas over the corresponding edge areas of the upper part guide slot 7 so that the entire ejection device 4 on the upper housing part 3 cannot be lost and is held in such a manner that it can be displaced in the direction of the upper part guide slot 7. At its free end area the shaft 16 has a contact element 10 preferably having the form of a plate, said contact element being fixed on the shaft 16 in such a manner that it cannot be displaced in the axial direction and on which contact faces 10' explained in more detail later are disposed on the side facing the upper part 3. A contact element energy storage device 15 is provided which is active between the lower sliding plate 14 and the contact element 10 and presses them away from one another. Preferably this contact element energy storage device 15 has the form of a helical spring encircling the shaft 16, one end of said helical spring being supported on the lower sliding plate 14 and the other end of said helical spring being supported on the contact element 10.

Due to the contact element energy storage 15 and the support of the lower sliding plate 14 on the edge area of the upper part guide slot 7 of the upper part 3, the shaft 16 and the upper sliding plate 13 fastened thereon are caused to be drawn downward with the ejection part 48 in the direction of the lower part 20. At the edge areas of the upper part guide slot 7, in the area of each upper ejection opening 6, pairs of contact points 9', 9 are located which are connected to one another by the contact fields 10' of the contact element 10 when the ejection ram 19 is in its ejection position, that is, when the ejection part 48 is pivoted about the axis 5 parallel to the plane of the upper part 3 and in so doing the contact plate 10 is drawn upward against the force to the contact element energy storage device 15, as is represented in FIG. 8. If, on the contrary, the ejection part 48 is pivoted upward about the axis 5 (arrow 3 in FIG. 7), where the ejection ram 19 is moved out of the ejection position, the contact plate 10 is moved downward by the force of the contact element energy storage device 15, that is, in the direction of the lower part 20 so that the contact fields 10' of the contact element 10 are moved away from the contact points 9', 9 and they are no longer electrically connected.

Figure 7:
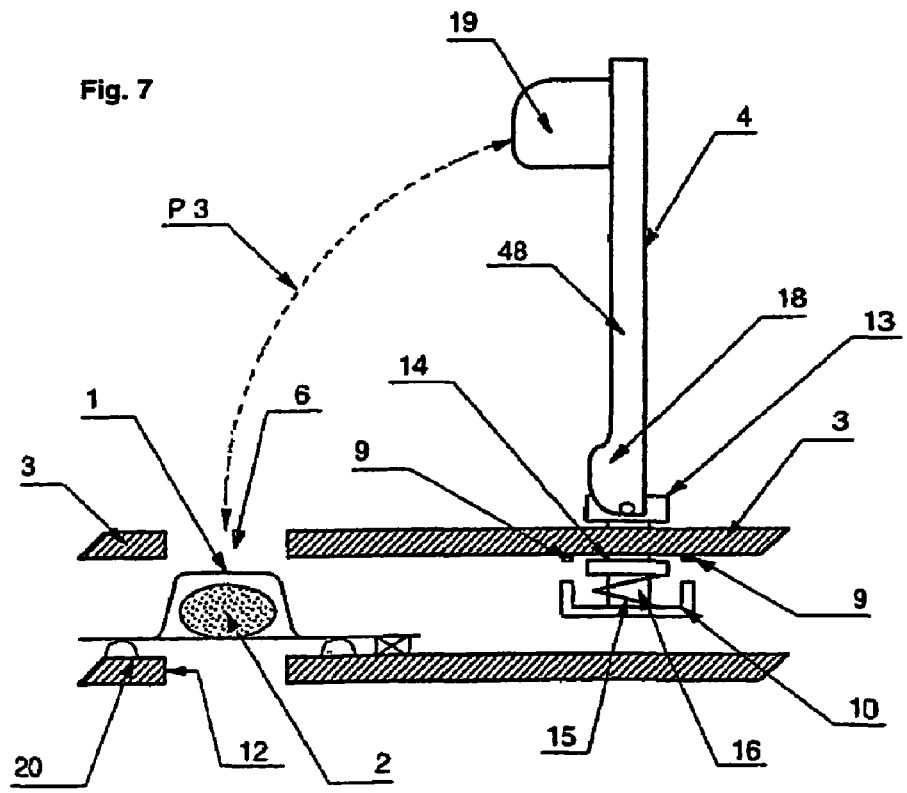
Figure 8:
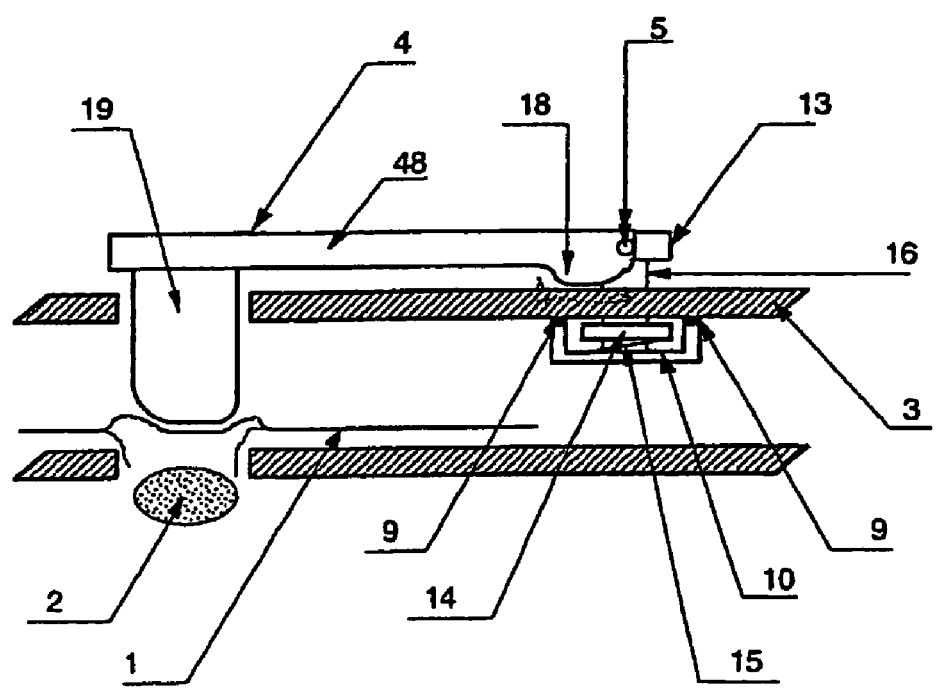

In order to make possible said movement of the shaft 16 and of the contact element 10, the ejection device 4 has a cam 18, which is represented, in particular in FIGS. 7 and 8, and which is responsible for ensuring that, on pivoting of the ejection ram 19 into the ejection position, the arc-like curve of the cam 18 acts on the upper part 3, stated more precisely on the edge area of the upper part guide slot 7, in order to lift the shaft 16 against the force of the contact element energy storage device 15. In reverse, on pivoting of the ejection ram 19 out of the ejection position the cam 18 is moved so that the contact element energy storage device 15 is relaxed and in doing so the contact element 10 moves downward.

Preferably a cam 18 is provided in the area of each aforementioned fork arm of the ejection part 48.

The present holding device for a pharmaceutical blister 1 has evaluation electronics 25 which preferably comprises a display 38 for displaying the information determined.

Figure 12:
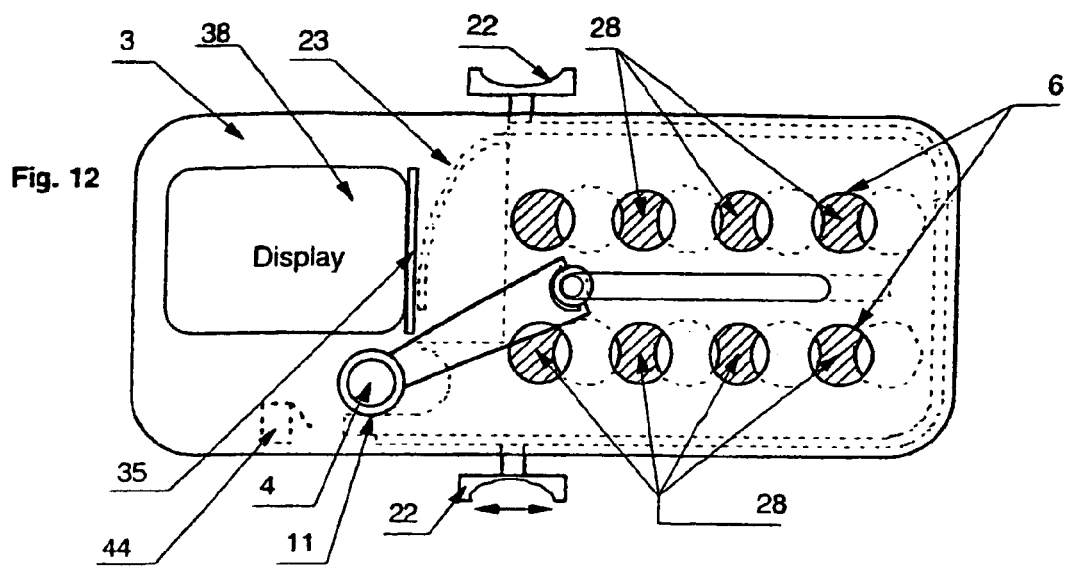

The ejection ram 19 can be moved according to FIG. 12 by corresponding displacement and turning of the ejection device 4 into a parked position 11 and from this position to the individual ejection positions for the sequential ejection of dragées 2 of a pharmaceutical blister 1. The parked position 11 is formed by at least one opening in the upper part 3.

Always when the ejection ram 19 is in the parked position 11 or in an ejection position, preferably according to linear and rotary positioning of the ejection device 4, i. e. also of the contact element 10 or the contact fields 10' of the same, two contact points 9', 9 on the lower side of the upper part 3 are short-circuited so that individual position signals corresponding to the parked position 11 or a certain ejection position are generated and are issued to the evaluation electronics 25 in order to be stored and appropriately processed there. The parked position 11 can however also be structured so that no contacting occurs or is possible.

The evaluation electronics 25 is preferably disposed according to FIG. 5b on one side of the upper part 3 in an area 41 of the housing, said area projecting over the lower part 20 preferably in the direction of the upper part guide slot 7 of the upper part 3. The connection between the individual contact point 9', 9 and the evaluation electronics 25 can be produced according to FIG. 10 via printed conductors 8, 17.

According to FIG. 3 these printed conductors 8, 17 are disposed on the underside of the upper part 3, where expediently a contact point 9' of the parked position 11 and a contact point 9' of the ejection positions are connected via a common printed conductor 17 to the evaluation electronics 25 and the other contact point 9 of the parked position 11 and the ejection positions is connected via an individual printed conductor 8 to the evaluation electronics 25.

A power source or battery 26 is preferably assigned to the evaluation electronics 25 and the display 38, said power source or battery being expediently located in the housing 41.

On actuation of the ejection device 4 a dragée 2 according to FIGS. 7 and 8 is ejected from the pharmaceutical blister 1 by the ejection ram 19 during the ejection process. In so doing, the shaft 16 is lifted by the cam 18, where the contact fields 10' of the contact element 10 strike and electrically connect the corresponding contact points 9, 9'. This information is directly related to the removal of a dragée at a certain ejection position. The corresponding information in the form of a flow of current from the evaluation electronics 25 over the corresponding printed conductor 8, over the contact points 9', 9, and over the printed conductor 17 back to the evaluation electronics 25 is recorded and evaluated in the evaluation electronics 25 as a position signal.

Preferably the striking of the contact point 9', 9 only occurs when a dragée 2 has completely penetrated the aluminum foil of the pharmaceutical blister 1.

In the following it is explained in more detail in connection with FIGS. 9 to 11 in what manner the contact fields 10' of the contact element 10 are made so that for each possible ejection position a special position signal characterizing this position can be generated via the printed conductors 8, 17.

FIG. 9 shows a view from above of the side, facing the upper part 3, of the contact element 10 which in the transverse direction relative to the axis of the shaft 16 has the opposite contact fields 10'. According to FIG. 10 the ejection ram 19 is resting in its parked position 11. If the ejection ram 19 is moved to remove a dragée 2, e. g. into the ejection position B where the contact element 10 is correspondingly displaced along the upper part guide slot 7 of the upper part 3 and the ejection ram 19 is correspondingly turned about the axis of the shaft 16, then the contact fields 10' of the contact element 10 strike the contact point 9' assigned to the ejection position B on the side, facing the contact element 10, of the upper part 3 as well as the contact point 9' which is also assigned to the ejection position B and moreover is connected to a printed conductor 17 which connects all the additional contact points 9' of all the ejection positions to one another and leads to the evaluation electronics 25. Preferably this common printed conductor 17 runs starting from the evaluation electronics 25 annularly around the upper part guide slot 7 in order to produce a connection to all the additional contact points 9' disposed on both sides of the upper part guide slot 7.

On moving the ejection ram 19 into the ejection position H the contact element 10 is accordingly displaced relative to the upper part guide slot 7 and accordingly turned about the shaft 16.

Figure 11:
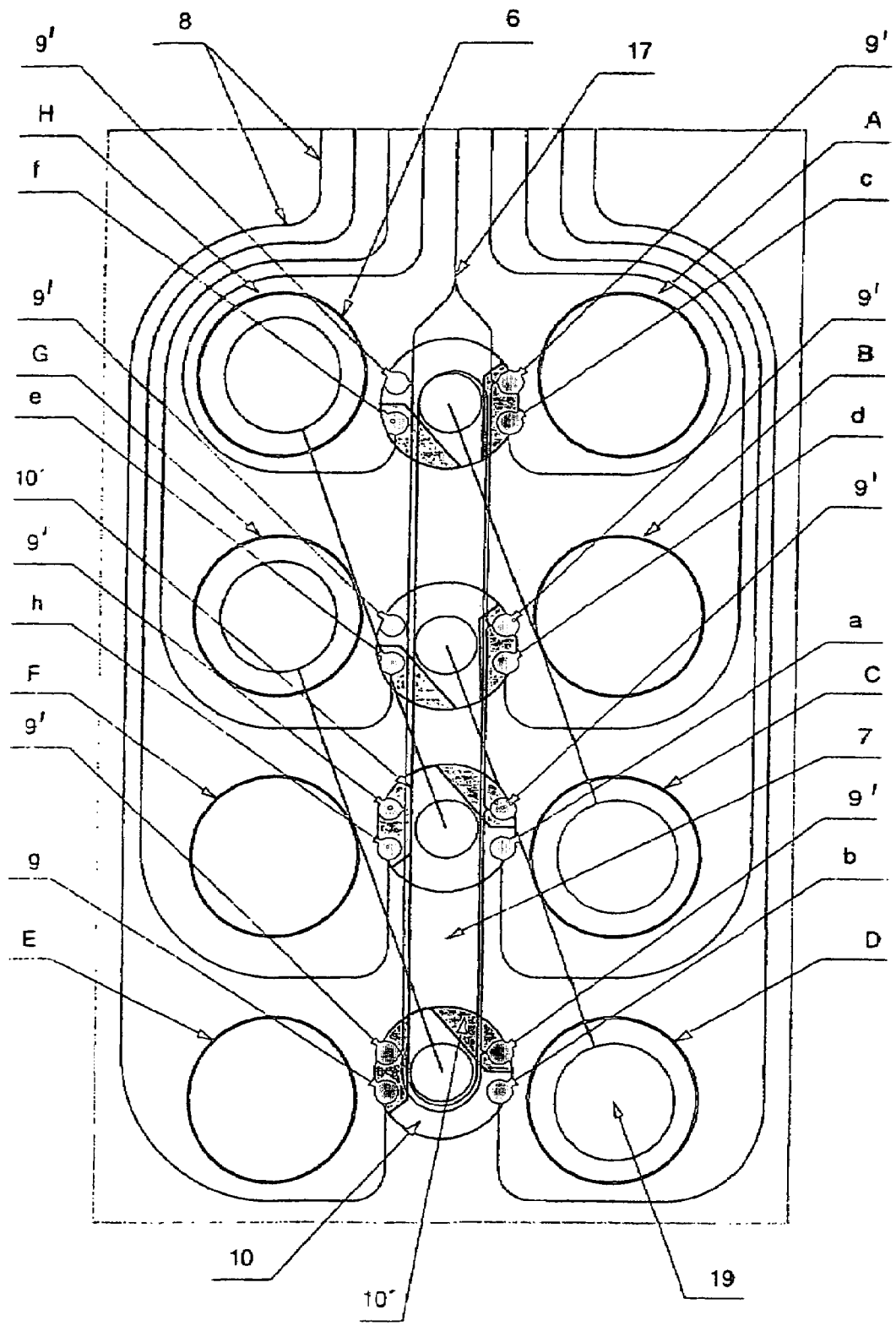

According to FIG. 11 the geometry of the contact fields 10' is made or designed so that the contact positions 9' assigned to each ejection position, e. g. to the positions B and H and b or h are bridged or short-circuited. To illustrate this the contact points of the different ejection positions A–H which are connected to the common printed conductor 17 are designated by 9' in FIG. 11.

By way of example, the ejection positions C, D, G, H, and the corresponding contact field arrangements C: c/9', D: d/9', G: d/9', H: h/9' are represented.

In the other ejection positions A, B, E, and F the following assignments apply: A: a/9', B: b/9', E: e/9', F: f/9'.

It can be seen clearly that in each special ejection position the contact fields 10' of the contact element 10 short-circuit only the pair of contact points 9', a or 9', b or 9', c or 9', d or 9', e or 9', f, or 9', g, or 9', h assigned to the intended ejection position. The opposite contact field 10' of the contact element 10 always strikes only one contact point and represents no connection between a pair of contact points.

In the following a form of embodiment of the present holding device for pharmaceutical blisters is explained in connection with the FIGS. 12 to 15, said holding device having a child safety. A child safety of this type is also explained in the Patent Specification DE 101 17 913.3 A1 of the same applicant on the same date whose description is hereby also made part of the contents of the present patent application.

Essentially the child safety consists of a link or movable circuit board 21 mounted in such a manner that it can be displaced between the upper part 3 and the lower part 20 parallel to the planes of the same, said movable circuit board 21 preferably being mounted in a guide groove 36 which runs in the longitudinal direction of the upper part 3. The guide groove 36 is preferably formed by a wall part 42 running from the outer edge of the upper part 3 in the direction of the lower part 20 and an additional wall part 43 running parallel to the plane of the upper part 3.

Figure 13:
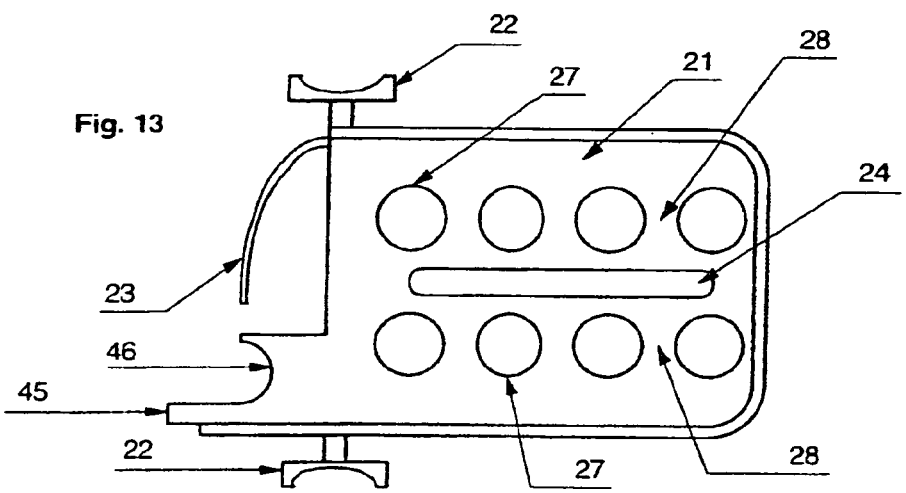
Figure 14:
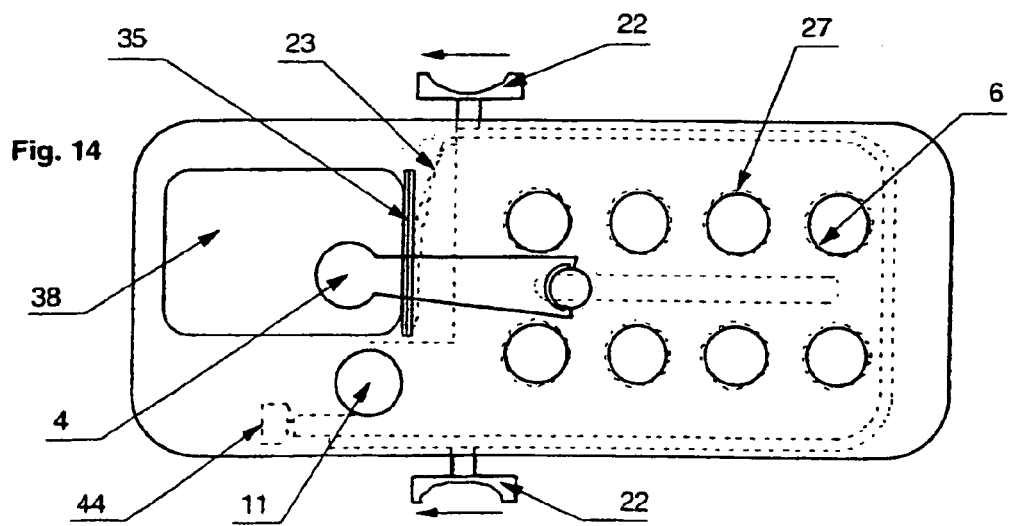

In the manner that can be seen from FIGS. 12 to 14 the movable circuit board 21 is formed from a resting position against the force of a movable circuit board energy storage device 23, which is preferably a leaf spring formed on in the form of an arc on the side, facing the evaluation electronics 25, of the movable circuit board 21, said leaf spring being supported against a supporting wall 35 which is formed on the side, facing the lower part 20, of the upper part 3. On the movable circuit board 21 at least one plate part 22 is formed which runs outward through a longitudinal opening (not represented) of the wall part 42. Preferably the movable circuit board 21 has plate parts 22 of this type lying opposite in the transverse direction on both sides.

In the movable circuit board 21, circuit board ejection openings 27 are also arranged conforming to the pattern of the pharmaceutical blister 1 in such a manner that they, in the resting position of the movable circuit board 21, are not aligned to the upper ejection openings 6 of the upper part 3 so that an ejection of dragées 2, due to the segments 28 present between each two circuit board ejection openings 27, adjacent in the longitudinal direction of the movable circuit board 21, the ejection ram 19 cannot be brought into the ejection positions since the segments 28 at least partially cover the upper ejection openings 6.

Only when the movable circuit board 21 is moved, against the forces of the movable circuit board energy storage device 23 with the aid of the plate parts 22, into the stop position, which will be explained later, are the circuit board ejection openings 27 of the movable circuit board 21 aligned to the upper ejection openings 6 of the upper part 3 so that the ejection ram 19 can be guided through the upper ejection openings 6 and the circuit board ejections openings 27, aligned to one another, of the chosen ejection position. On the upper part 3 a switch 30 can be disposed whose contact is actuated by an area of the movable circuit board 21, preferably by a contact nose 45 of the same, when the movable circuit board 21 is in the stop position represented in FIG. 14. This stop position is, by way of example, formed due to the fact that the movable circuit board 21 stops with a stop edge 46 on the ejection ram 19 when it is in the parked position 11.

Figure 16A:
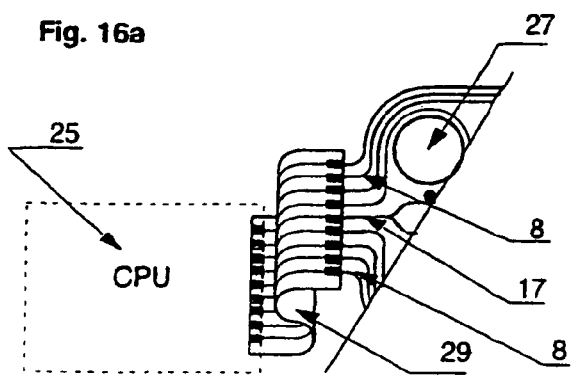
Figure 16B:
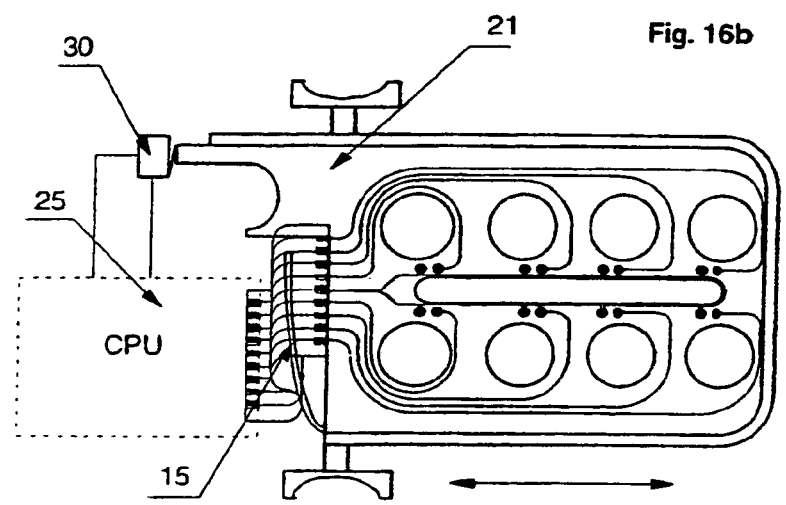

Since the movable circuit board 21 can be moved between said resting position and the stop position in the longitudinal of the holding device, a flexible connection between the movable circuit board 21 and the evaluation electronics 25 must be produced. According to FIG. 16a this is accomplished via a so-called flexible connector 29 which has the form of a flexible band on which the printed conductors 8, 17 are disposed and whose one end is connected to the evaluation electronics 25 and whose other end is connected to the printed conductors 8, 17 of the movable circuit board 21.

According to FIG. 14 the movable circuit board 21 is in the stop position where the contact element energy storage device 15 is stressed and thus removal of a dragée is possible since the upper ejection openings 6 of the upper part 3 and the circuit board ejection openings 27 of the movable circuit board 21 are aligned congruently relative to one another. In this position the contact nose 45 of the movable circuit board 21 strikes the already mentioned switch 30, which allows a steady current to flow to the evaluation electronics 25 for the duration of the contact, that is, the battery 26 is connected to the evaluation electronics 25. As soon as the movable circuit board energy storage device 23 moves the movable circuit board 21 back in the direction of its resting position, the flow of current between the battery 26 and the evaluation electronics 25 is interrupted once again. This type of electric circuit is particularly advantageous since the lifetime of the battery 26 can be extended significantly in this way.

Figure 17A:
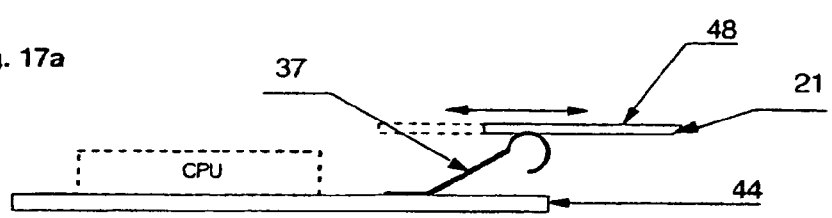
Figure 17B:
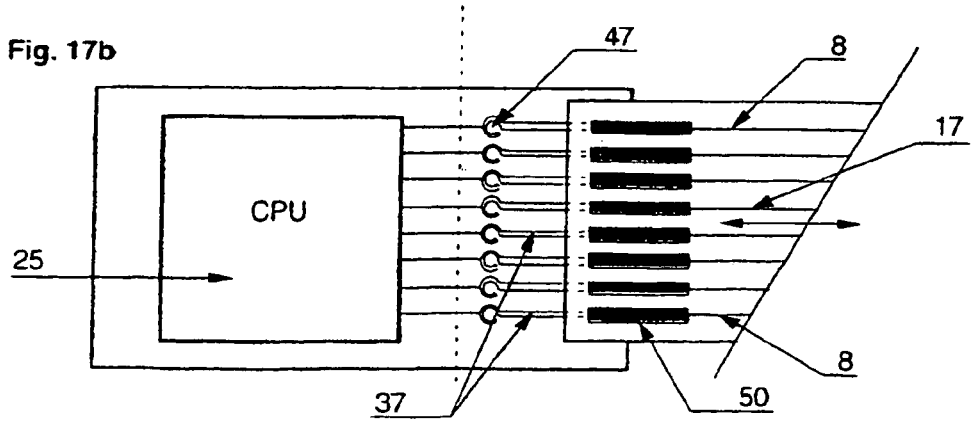

FIGS. 17a and 17b show contacting between the circuit board 44, the evaluation electronics 25, and the movable circuit board 21 with the aid of contact springs 37, which are connected in a fixed manner by their ends to the connections 47 of the circuit board 44. The other ends of contact springs 37 lie elastically on the contact faces 50 of the movable circuit board 21. They are electrically connected to the printed conductors 8 and 17 and run in the longitudinal direction of the movable circuit board 21. In this way the movable circuit board 21 can be displaced while maintaining the connections between the printed conductors 8 and 17 of the movable circuit board 21 and the connections 47 of the evaluation electronics 25 in relation to the upper part 3.

Figure 18:
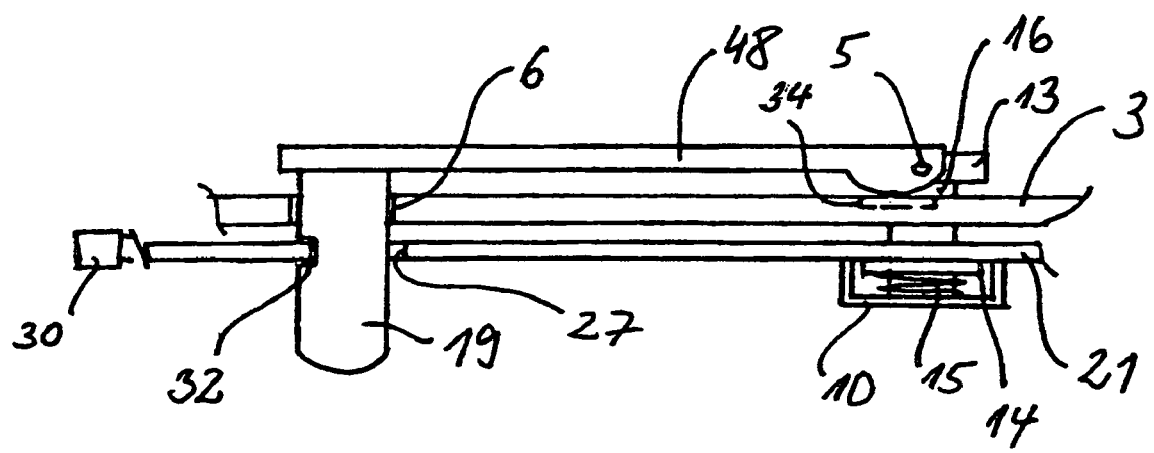

Finally, FIG. 18 shows the ejection ram 19 at the point in time of alignment of the upper ejection openings 6 of the upper part 6 and the circuit board ejection openings 27 of the movable circuit board 21. An annular indentation 32 in the ejection ram 19 permits the movable circuit board 21 to engage in the annular indentation 32 of the ejection ram 19 after release of the plate parts 22. Thereby it is achieved that the switch 30 is interrupted and the ejection ram 19 is arrested in the housing of the holding device.

So that in the parked position 11 of the holding device 4 the contact element energy storage device 15 remains relaxed, an indentation is preferably introduced in the upper part 3 of the pharmaceutical blister which receives the cam 18. Thereby it is achieved that the contact points 9, 9' are not struck by the contact element 10. Such an indentation 34 is represented schematically in FIG. 18 by a broken line.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

What is claimed is:

1. A holding device for pharmaceutical blisters comprising:

an upper part and a lower part between which a pharmaceutical blister can be disposed, where, conforming to a pattern of dragées contained therein, upper ejection openings are disposed in the upper part and lower ejection openings are disposed in the lower part; and an ejection device which can execute a linear movement and/or a rotary movement in relation to the upper part, the ejection device having an ejection ram which optionally can be guided into a certain upper ejection opening to eject a corresponding dragée through the corresponding lower ejection opening, the ejection device having a contact element which in an intended ejection position of the ejection ram short-circuits a pair of contact points with a contact field to detect the intended ejection position, the contact field for each possible ejection position short-circuiting only one pair of the contact points corresponding to the intended ejection position by the contact field, the ejection device having a shaft which engages through an upper part guide slot disposed in the upper part on which a sliding plate is fixed on a side of the upper part opposite to the lower part so that it cannot be displaced in an axial direction of the shaft, and which has the contact element fixed on another side facing the lower part so that it cannot be displaced in the axial direction of the shaft, wherein between the upper part and the contact element a contact element energy storage device is operable to draw the shaft in the direction of the lower part, and the ejection device having a cam which, during actuation of the ejection ram of the ejection device into the ejection position, moves the contact element against the force of the contact element energy storage device in the direction of the upper part so that the contact field of the contact element abuts the pair of contact points corresponding to the intended ejection position of a removal point, and in which in the position of the ejection device moved out of the ejection position releases the shaft so that the contact element energy storage device moves the shaft and thus the contact element connected thereto so that the contact field of the contact element is separated from the pair of contact points, corresponding to the intended ejection position.

2. The holding device according to claim 1, wherein the contact element energy storage device has the form of a helical spring encircling the shaft.

3. The holding device according to claim 2, wherein the helical spring is supported via a second sliding plate, disposed in such a manner that it can be moved in the axial direction onto the shaft, on the upper part.

4. The holding device according to claim 1, wherein the ejection device has an ejection part on which the ejection ram is disposed and which can be pivoted, in relation to the first sliding plate, about an axis running transverse to a longitudinal axis of the shaft, and the ejection part has, in an area of the axis, the cam which acts on the lower side of the upper part that is opposite the lower part.

5. The holding device according to claim 3, wherein the first sliding plate and/or the second sliding plate has an edge area that engages over the upper part guide slot.

6. The holding device according to claim 1, wherein the upper part has evaluation electronics electrically connected to the pairs of contact points via printed conductors.

7. The holding device according to claim 6, wherein a first contact point, assigned to the upper ejection opening, of the pair of contact points is connected via an individual printed conductor to the evaluation electronics, and wherein a second contact point, assigned to the upper ejection opening, of the pairs of contact points is connected to the evaluation electronics via a common printed conductor.

8. The holding device according to claim 6, wherein the evaluation electronics is disposed in an area of the upper part that projects over the lower part.

9. The holding device according to claim 1, wherein the pairs of contact points are disposed on the lower side of the upper part that faces the lower part.

10. The holding device according to claim 1, wherein between the upper part and the pharmaceutical blister disposed between the upper part and the lower part, a movable circuit board is disposed which can be moved in the longitudinal direction of the upper part guide slot, against the force of a movable circuit board energy storage device, between a resting position and a release position, the movable circuit board having circuit board ejection openings conforming to the pattern of the dragées of the pharmaceutical blister, said circuit board ejection openings being aligned in a release position to the upper part ejection openings, where the upper part ejection openings, in a resting position of the circuit board, are covered, at least partially, by segments located between each two adjacent circuit board ejection openings, and output connections of evaluation electronics are connected via a connecting device to printed conductors which lead to the pairs of contact points disposed on the movable circuit board, the movable circuit board having, corresponding to the upper part guide slot, a movable circuit board guide slot through which the shaft runs, the contact element being disposed on a side of the movable circuit board that faces the lower part, and the contact element energy storage device being effective between the movable circuit board and the contact element.

11. The holding device according to claim 10, wherein the contact element energy storage device has the form of a helical spring encircling the shaft, said helical spring being supported via a second sliding plate, disposed to be moved in the axial direction, on the movable circuit board.

12. The holding device according to claim 10, wherein the connecting device has the form of a flexible band producing the connection between the printed conductors of the movable circuit board and connection contacts of the evaluation electronics, on which flexible band connecting lines are disposed.

13. The holding device according to claim 10, wherein the connecting device has contact springs connected by their ends in a fixed manner to connections of the evaluation electronics and which abut in an elastic manner at their ends contact faces of the movable circuit board which are disposed in a longitudinal direction running on the circuit board and connected to the printed conductors.

14. The holding device according to claim 10, wherein the movable circuit board energy storage device has the form of a tongued spring element connected as a single piece to the movable circuit board.

15. The holding device according to claim 14, wherein the tongued spring element abuts a supporting wall disposed on a side of the upper part that faces the movable circuit board, of the upper part.

16. The holding device according to claim 10, wherein the movable circuit board has a stop edge disposed to generate a switching signal displaying the release position so as to actuate a switch connected to the evaluation electronics when the circuit board is in the release position.

17. The holding device according to claim 10, wherein the movable circuit board has at least one plate part which projects out over upper part transverse to the upper part guide slot.

18. The holding device according to claim 17, wherein two plate parts are provided opposite and transverse to the upper part guide slot.

19. The holding device according to claim 10, wherein the upper part has a parked position having the form of an opening for holding the ejection ram of the ejection device, the ejection ram capable of being guided into the parked position when the movable circuit board is in the resting position.

20. The holding device according to claim 19, wherein the upper part has an indentation which receives the cam when the ejection ram is in the parked position so that the corresponding pairs of contact points are not contacted by the contact field.

21. The holding device according to claim 17, wherein the ejection ram has an indentation into which, when the ejection ram is in the ejection position, after the release of the plate part of the movable circuit board, said movable circuit board engages with an edge area segment thereof and is withdrawn slightly from the release position to interrupt a switch.

22. The holding device according to claim 1, wherein the contact element has two opposite contact fields transverse to an extension of the upper part guide slot and the pairs of contact points are disposed on both sides of the upper part guide slot.

23. The holding device according to claim 10, wherein the contact element has two opposite contact fields transverse to an extension of the movable circuit board guide slot, and pairs of contact points are disposed on both sides of the movable circuit board guide slot.

24. A holding device for a pharmaceutical blister, comprising:
an upper part and a lower part with the pharmaceutical blister for holding dragées disposed therebetween, the upper part having a pattern of upper ejection openings and the lower part having a pattern of lower ejection openings, the upper ejection openings pattern and the lower ejection openings pattern corresponding to a dragée pattern; and an ejection device executing a linear movement and/or a rotary movement in relation to the upper part, the ejection device having an ejection ram capable of being guided into any one of the upper ejection openings so as to eject a corresponding dragée through the corresponding lower ejection opening, the ejection device having a contact element, a pair of contact points, and a contact field for electronically detecting an ejection position, so that in the ejection position the contact element short-circuits the pair of contact points with the contact field so as to detect the ejection position, the contact field for each possible ejection position short-circuiting only one pair of the contact points corresponding to the intended ejection position, the ejection device having a shaft capable of traveling longitudinally through an upper part guide slot, the shaft being fixed to a slidable plate disposed on an upper side of the upper part opposite to the lower part, and being fixed to a contact element disposed on a lower side of the upper part facing the lower part, with a contact element energy storage device disposed between the upper part and the contact element, the contact element energy storage device capable of moving the shaft toward the lower part, and the ejection device having a cam that, during actuation of the ejection ram into the ejection position, moves the contact element against a force exerted by the contact element energy storage device in the direction of the upper part so that the contact field of the contact element contacts the pair of contact points corresponding to the intended ejection position, and during actuation of the ejection ram out of the ejection position, releases the shaft so that the contact element energy storage device moves the shaft and thus the contact element out of contact with the pair of contact points.

25. The holding device for a pharmaceutical blister according to claim 24, further comprising a movable circuit board disposed between the upper part and the pharmaceutical blister, the movable circuit board capable of travel, against the force of a movable circuit board energy storage device, between a rest position and a release position in the longitudinal direction of the upper part guide slot, the movable circuit board having circuit board ejection openings corresponding to the dragée pattern, the circuit board ejection openings being aligned in the release position with the upper part ejection openings, and the upper part ejection openings in the rest position being partially covered by solid segments of the movable circuit board, the movable circuit board having, corresponding to the upper part guide slot, a movable circuit board guide slot through which the shaft travels, with the contact element being disposed on a side of the movable circuit board that faces the lower part, and the movable circuit board energy storage device being operable between the movable circuit board and the contact element.

* * * * *